United States Patent
Cherian

(10) Patent No.: US 11,533,135 B2
(45) Date of Patent: *Dec. 20, 2022

(54) MEMORY CONSERVATION IN DELTA-COMPRESSED MESSAGE TRANSMISSION AND RECOVERY

(71) Applicant: TD Ameritrade IP Company, Inc., Omaha, NE (US)

(72) Inventor: Sanjay John Cherian, Bangalura (IN)

(73) Assignee: TD Ameritrade IP Company, Inc., Omaha, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/366,680

(22) Filed: Jul. 2, 2021

(65) Prior Publication Data

US 2021/0336729 A1     Oct. 28, 2021

Related U.S. Application Data

(63) Continuation of application No. 16/571,022, filed on Sep. 13, 2019, now Pat. No. 11,057,164.

(51) Int. Cl.
*H04L 1/00*         (2006.01)
*H04L 1/18*         (2006.01)
(Continued)

(52) U.S. Cl.
CPC ...... *H04L 1/1858* (2013.01); *H03M 13/1515* (2013.01); *H04L 1/0061* (2013.01); *H04L 1/0072* (2013.01); *H04L 51/214* (2022.05)

(58) Field of Classification Search
None
See application file for complete search history.

(56) References Cited

U.S. PATENT DOCUMENTS 5,771,244 A * 6/1998 Reed ............... H03M 13/151
                                                714/752
6,789,128 B1 * 9/2004 Harrison ............ H04L 69/04
                                                707/999.203
(Continued)

OTHER PUBLICATIONS

Trendafilov, et al; zdelta: An Efficient Delta Compression Tool; Polytechnic University; Department of Computer and Information Science; Technical Report TR-CIS-2002-02; Jun. 26, 2002; 16 pages.

(Continued)

*Primary Examiner* — Daniel F. McMahon
(74) *Attorney, Agent, or Firm* — Harness, Dickey & Pierce, P.L.C.

(57) ABSTRACT

Instructions stored on a computer-readable medium include, in response to receiving a new message for transmission, generating a candidate message by attempting recovery of a previous message from the new message and recovery bits of the previous message. The instructions include, in response to an indicator indicating that the attempted recovery was successful, computing a delta between the new message and the candidate message and generating a delivery message based on the computed delta. The instructions include, in response to the indicator indicating that the attempted recovery was unsuccessful, generating the delivery message based on the new message exclusive of the computed delta. The instructions include calculating new recovery bits from the new message. The instructions include storing the new recovery bits as the recovery bits of the previous message. The instructions include transmitting the delivery message to a destination over a communications channel.

20 Claims, 6 Drawing Sheets

(51) Int. Cl.
*H03M 13/15* (2006.01)
*H04L 51/214* (2022.01)

(56) References Cited

U.S. PATENT DOCUMENTS

| | | | | |
|---|---|---|---|---|
| 7,010,607 | B1* | 3/2006 | Bunton | H04L 1/18 |
| | | | | 709/228 |
| 10,459,647 | B1* | 10/2019 | Lazier | G06F 3/064 |
| 2006/0212782 | A1* | 9/2006 | Li | H03M 13/1575 |
| | | | | 714/784 |
| 2011/0270887 | A1 | 11/2011 | Reddy et al. | |
| 2012/0310890 | A1 | 12/2012 | Dodd et al. | |
| 2014/0052700 | A1 | 2/2014 | VanderSpek et al. | |
| 2014/0281780 | A1 | 9/2014 | Branscome et al. | |
| 2015/0326350 | A1* | 11/2015 | Macikunas | H04L 1/0041 |
| | | | | 714/776 |
| 2016/0056842 | A1* | 2/2016 | Linstadt | H04L 1/0047 |
| | | | | 714/776 |
| 2018/0293139 | A1 | 10/2018 | Defiebre et al. | |
| 2020/0328841 | A1* | 10/2020 | Babich | G06N 7/005 |

OTHER PUBLICATIONS

International Search Report and Written Opinion for PCT Application No. PCT/IB2020/058492; dated Dec. 8, 2020; 9 pages.

B. Ramamurthy, S. Upadhyaya and B. Bhargava, "Design and analysis of an integrated checkpointing and recovery scheme for distributed applications," in IEEE Transactions on Knowledge and Data Engineering, vol. 12, No. 2, pp. 174-186, Mar.-Apr. 2000, doi: 10.1109/69.842261. (Year: 2000).

\* cited by examiner

MEMORY CONSERVATION IN DELTA-COMPRESSED MESSAGE TRANSMISSION AND RECOVERY

CROSS-REFERENCE TO RELATED APPLICATIONS

This application is a continuation of U.S. patent application Ser. No. 16/571,022 filed Sep. 13, 2019, the entire disclosure of which is incorporated by reference.

FIELD

The present disclosure relates to systems and methods of message transmission and more particularly to transmitter-side message recovery.

BACKGROUND

Users, operators, and administrators of computers distributed over a network benefit when the volume of data transferred over the network is reduced. Among many other benefits, reducing network traffic increases the responsiveness of user interfaces and uses available networking hardware more efficiently. However, improvements to network bandwidth have not improved at the same rate as corresponding improvements to central processing units (CPU) power or available random access memory (RAM). Therefore, overall, it is beneficial to increase CPU and memory usage if network usage can be reduced.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A communication system includes at least one processor and a memory coupled to the at least one processor. The memory stores recovery bits of a previous message and instructions. The instructions, upon execution, cause the at least one processor to, in response to receiving a new message, selectively generate a candidate message by attempting recovery of the previous message from the new message and the recovery bits of the previous message. The instructions cause the at least one processor to, in response to an indicator indicating that the recovery was successful, compute a delta between the new message and the candidate message and generate a delivery message based on the computed delta. The instructions cause the at least one processor to, in response to the indicator indicating that the recovery was unsuccessful, generate the delivery message based on the new message. The instructions cause the at least one processor to calculate new recovery bits from the new message, replace the stored recovery bits of the previous message with the new recovery bits, and transmit the delivery message to a destination over a communications channel.

In other features, the computed delta is a compressed delta between the new message and the candidate message. In other features, the recovery bits of the previous message include a checksum of the previous message. In other features, the instructions include calculating a candidate checksum from the candidate message and, in response to the checksum of the previous message being different than the candidate checksum, setting the indicator to indicate that the recovery was unsuccessful.

In other features, the instructions include setting the indicator to indicate that the recovery was unsuccessful in response to a failure to generate the candidate message. In other features, the instructions include skipping calculating the candidate checksum in response to a failure to generate the candidate message. In other features, the attempted recovery of the previous message is performed using an error-correcting code.

In other features, the instructions include generating new recovery bits from the new message using the error-correcting code and replacing the recovery bits of the previous message with the new recovery bits. In other features, the attempted recovery of the previous message is performed using Reed-Solomon decoding and the new recovery bits are generated from the new message using Reed-Solomon encoding.

In other features, the instructions include concatenating the new message with at least some of the recovery bits of the previous message to generate a combined message from which the attempted recovery is performed. In other features, the instructions include generating new recovery bits from the new message using Reed-Solomon encoding and replacing the recovery bits of the previous message with the new recovery bits.

In other features, generating the delivery message based on the new message includes generating a wrapper delta including the new message and incorporating the wrapper delta into the delivery message. In other features, the delivery message generated based on the computed delta includes the computed delta and excludes the new message. In other features, the communications channel is lossy.

In other features, the communication system of includes a receiver configured to store a prior received message and receive a new received message over the communications channel. The receiver is configured to, in response to the new received message including an entire message, set the entire message as an output message. The receiver is configured to, in response to new received message including a delta, generate the output message based on the delta and the prior received message. The receiver is configured to output the output message.

In other features, the receiver is configured to replace the prior received message with the output message. In other features, the new received message includes a type indication denoting whether the new received message includes the delta or the entire message.

A communication method includes, in response to receiving a new message, obtaining recovery bits of a previous message. The recovery bits of the previous message are stored at a transmitter. The method includes selectively generating a candidate message by attempting recovery of the previous message from the new message and the recovery bits of the previous message. The method includes, in response to an indicator indicating that the recovery was successful, computing a delta between the new message and the candidate message and generate a delivery message based on the computed delta. The method includes, in response to the indicator indicating that the recovery was unsuccessful, generating the delivery message based on the new message. The method includes, calculating new recovery bits from the new message, replacing the stored recovery bits of the previous message with the new recovery bits, and transmitting the delivery message to a destination over a communications channel.

In other features, the method includes calculating a candidate checksum from the candidate message and, in response to a checksum of the previous message being different than the candidate checksum, setting the indicator to indicate that the recovery was unsuccessful. The recovery bits of the previous message include the checksum of the previous message.

In other features, the computed delta is a compressed delta between the new message and the candidate message. In other features, the method includes generating the delivery message based on the new message includes generating a wrapper delta including the new message and incorporating the wrapper delta into the delivery message.

In other features, the method includes storing, at a receiver, a prior received message and receiving, at the receiver, a new received message over the communications channel. The method includes, in response to the new received message including an entire message, setting, by the receiver, the entire message as an output message and, in response to new received message including a delta, generating, by the receiver, the output message based on the delta and the prior received message. The method includes outputting, by the receiver, the output message.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
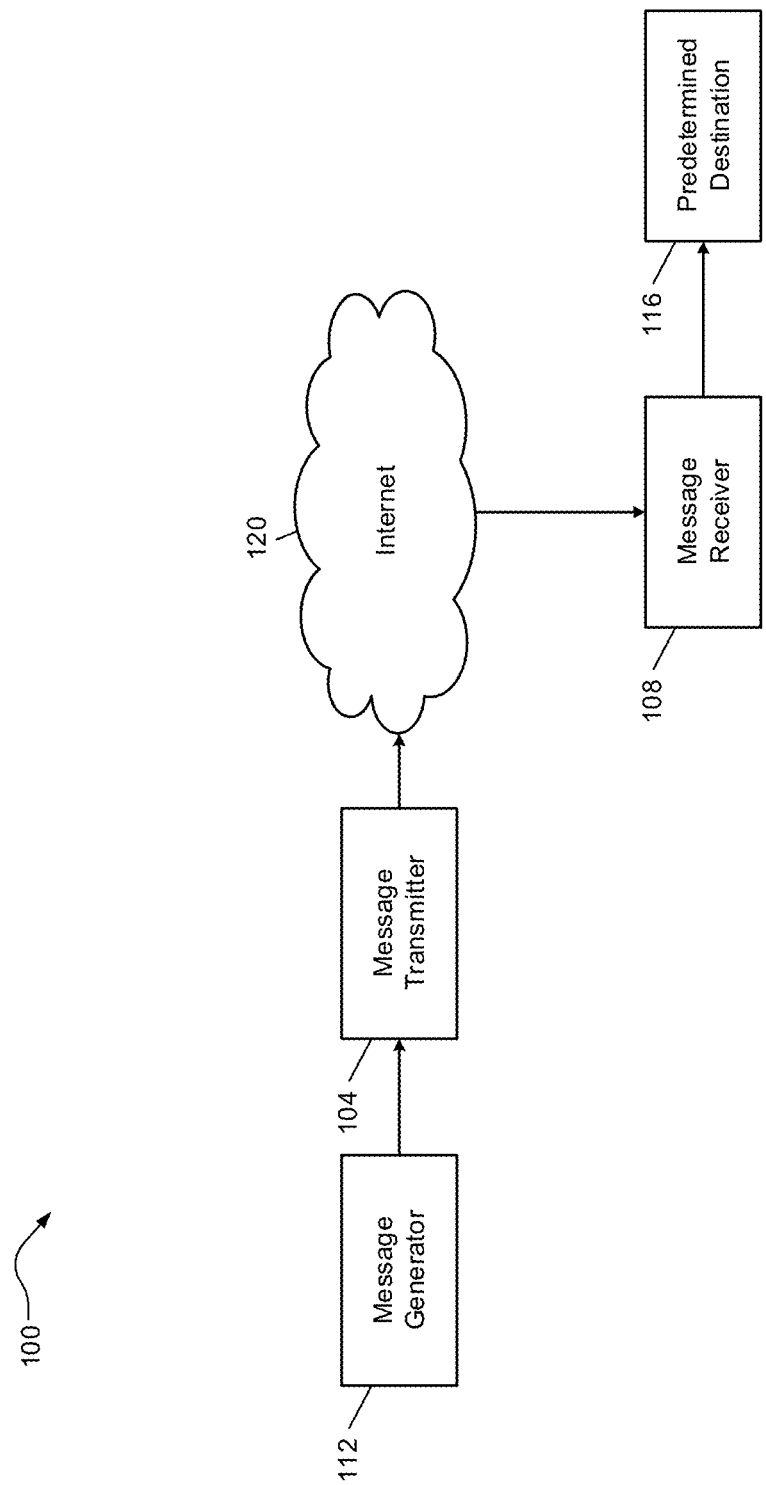
FIG. 1 is a high-level example block diagram of a message communication system including a message transmitter and a message receiver.

A message communication system according to the present disclosure implements delta compression to transmit messages. That is, instead of transmitting the entirety of a new message, the system selectively transmits just the difference between the new message and the prior message. To reduce memory usage on the transmit side, a transmitting device of the message communication system stores only check bits of the prior message instead of the entire prior message. For example only, the check bits may be generated using Reed-Solomon encoding.

Generally, error-correcting codes are used to improve transmission of messages over noisy transmission media, where check bits are added during encoding to help the recipient recover the original message. Therefore, if a message is corrupted in transmission, the message may be recovered using check bits. The present disclosure recognizes that if a new message is similar enough to the prior message, the new message may be treated as a corrupted version of the prior message. Then, the check bits can be used to recover the prior message from the new message (conceptually, the corrupted version of the prior message). For example, a Reed-Solomon decoder may be provided with the new message and the check bits of the prior message. If the new message is too dissimilar from the prior message, construction of the prior message from the new message and the check bits will fail.

In other words, the transmitter can store just the check bits of the prior message rather than the entire prior message. Then, for transmission of a new message, recovery of the prior message is attempted. If the recovery succeeds, a delta between the new message and the recovered message can be computed and transmitted. On the other hand, if the recovery fails, the prior message is not available for computing a delta and the entire new message is transmitted. This is acceptable because the failure indicates the new message differs substantially from the prior message, and therefore the computed delta would not have achieved significant compression anyway.

Substantial reductions in memory usage at the transmitter can therefore be achieved with the present disclosure. In addition, for systems in which memory that is highly local to the processor (for example, L1 or L2 cache memory) is in short supply, the present disclosure may allow deltas to be retained in the highly-local memory, avoiding high latency requests to external memory, such as dynamic random access memory (DRAM).

In various implementations, the recovery process is not able to detect degrees of dissimilarity after recovery; therefore, the recovery process could silently recover an incorrect previous message, if the new message is too dissimilar. That is, there is the possibility that the recovery process will successfully recover a message that does not match the prior message. In such implementations, a checksum of the prior message is retained. Then, when a candidate message is recovered, a checksum of the candidate message is compared to the retained checksum of the prior message. If the checksums match, the system knows that the prior message was successfully recovered from the new message and the check bits. Even in implementations where the prior message's checksum is retained, the combined storage space occupied by the prior message's check bits and the prior message's checksum is substantially less than the size that would be required by the prior message.

The receiver determines whether an entire message, or just a delta, is received. The receiver maintains a copy of the prior received message and, when a delta is received, constructs the new message from the received delta and the copy of the prior received message. The delta may be computed, and the new message constructed, according to a variety of mechanisms such as the zdelta 2.1 compression engine. For additional information, see "zdelta: An Efficient Delta Compression Tool," D. Trendafilov et al., Polytechnic University Department of Computer and Information Science Technical Report TR-CIS-2002-02, the entire disclosure of which is incorporated by reference. In various implementations, the message communication system is used to transmit updates to stock values by updating numerical values in real-time or near real-time.

FIG. 1 is a high-level example block diagram of a message communication system 100 including a message transmitter 104 and a message receiver 108. A message generator 112 forwards a message that is to be sent to a predetermined destination 116. In various implementations, the message generator 112 sends updates of stock values to the message transmitter 104 to send to the predetermined destination 116. For example, the message generator 112 may be an intermediary that transmits updated stock information to third parties in real-time. In various implementations, the message communication system 100 transmits updated values of a variety of information.

The message generator 112 forwards a message to the message transmitter 104. The message transmitter 104 calculates a delta between the message and a previously delivered message. The delta is transmitted to the message receiver 108 over a distributed communications network 120, such as the Internet. The message receiver 108 applies the delta to the previously delivered message to determine the message. Then, the message receiver 108 forwards the message to the predetermined destination 116. Delta compression and calculation is useful for implementing when a sequence of messages that are very similar are being transmitted. In various implementations, the message transmitter 104 and message generator 112 are included in a single device. Similarly, the message receiver 108 and the predetermined destination 116 may be included in another single device.

Generally, delta compression is implemented using either an interrogation method or retention method. The interrogation method involves the transmitter interrogating the receiver to obtain the information about the previously delivered message. Then, the transmitter determines how different the message is from the previous message in order to transmit a delta. The retention method involves the transmitter storing a copy of the previously delivered message to use as a reference. In the retention method, the memory usage is increased enough to store a copy of the previously delivered message. Using memory to store previously delivered messages is not ideal and is obviated by the message communication system 100.

Figure 2:
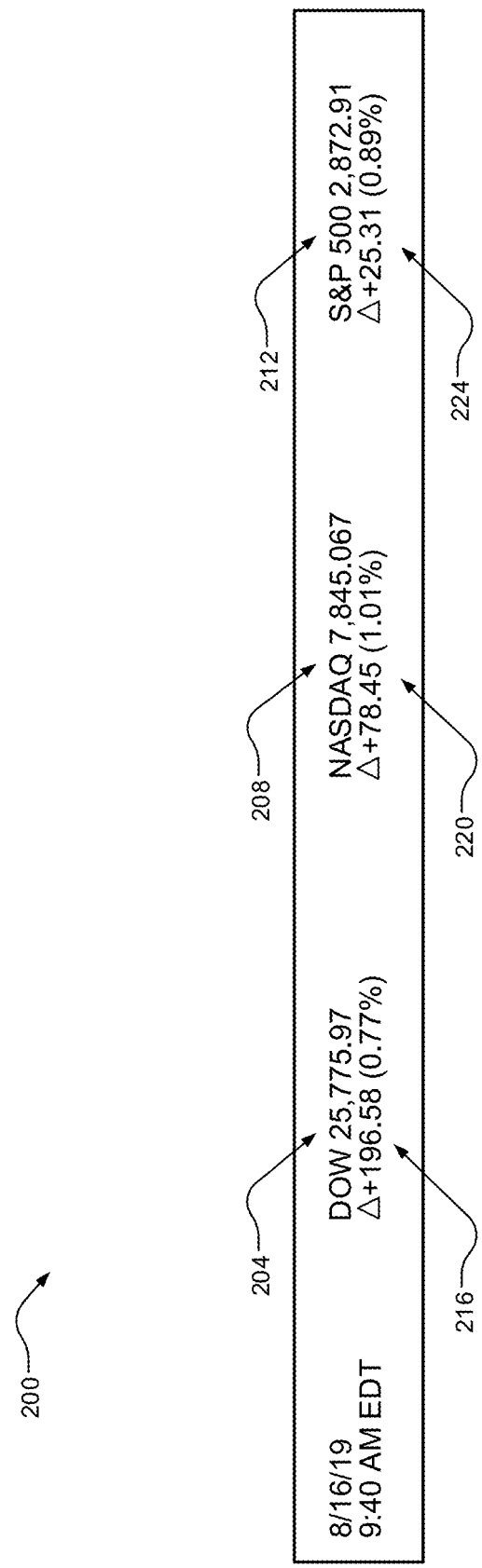
FIG. 2 is a representation of an example user interface presenting data included in messages according to the principles of the present disclosure.

FIG. 2 is a representation of an example user interface 200 presenting data included in messages according to the principles of the present disclosure. As shown in the example user interface 200, three indexes are displayed: a first index 204 is DOW, a second index 208 is NASDAQ, and a third index 212 is the S&P 500. The first index 204 has a first value 216 of +196.58, the second index 208 has a second value 220 of +78.45, and the third index 212 has a third value 224 of +25.31.

The three values 216, 220, and 224 are updated by data transmitted in messages so the updated information can be communicated to end users, for example, via a web portal consumed by end users. The transmitted messages can include a change in value or an updated value as well as an indicator for the index that corresponds to the change. For example, the message can identify the third index 212 with the third value 224 as a present value or, in the alternative, an amount equal to an increase or decrease between the present value and a previous value.

In various implementations, the message may also include the percent change shown next to each displayed value. Alternatively, a predetermined destination may include a calculation device to calculate a percent change based on previous messages and the message.

Figure 3:
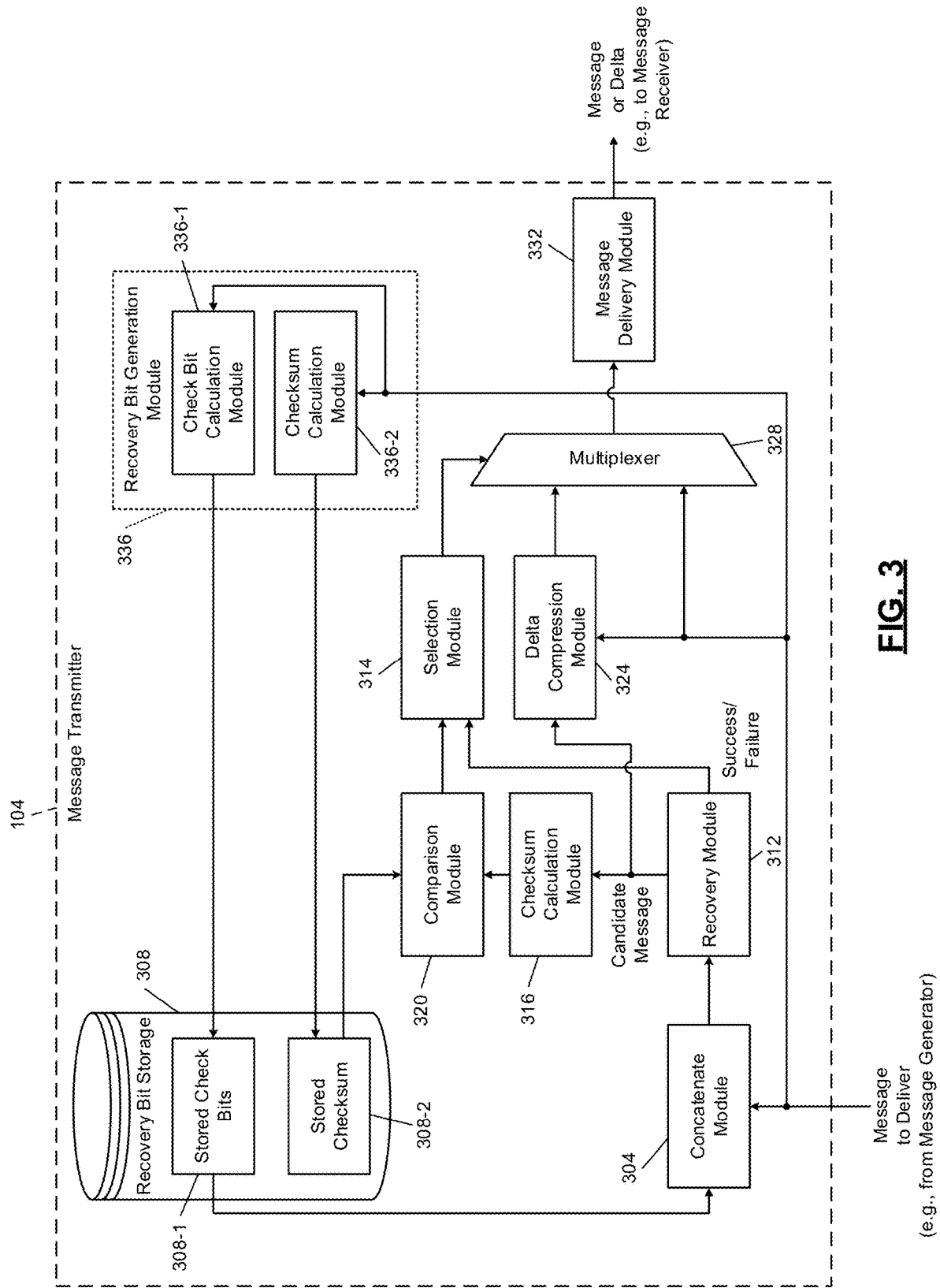
FIG. 3 is a functional block diagram of an example message transmitter according to principles of the present disclosure.

FIG. 3 is a functional block diagram of an example message transmitter according to principles of the present disclosure. The message transmitter 104 receives a message to deliver from the message generator 112 (both of FIG. 1). The message transmitter 104 includes a concatenate module 304. The concatenate module 304 receives the message to deliver from the message generator and obtains previously stored recovery bits from a recovery bits storage 308. The recovery bits storage 308 includes stored check bits 308-1 and a stored checksum 308-2. That is, instead of storing the previously delivered message as a whole, the message transmitter 104 only stores the recovery bits of the previously delivered message, including the store check bits 308-1 and the stored checksum 308-2. By implementing error-correcting code concepts in a new way, significant memory is conserved since the message transmitter 104 no longer needs to retain previously delivered messages. The concatenate module 304 appends the stored recovery bits (both the stored check bits 308-1 and the stored checksum 308-2) to the message as a concatenated message. Therefore, the concatenated message includes the message with the recovery bits of the previously delivered message attached.

A recovery module 312 receives the concatenated message. In various implementations, the recovery module 312 separately receives the store check bits 308-1 and the message to deliver. The recovery module 312 implements a recovery algorithm using the concatenated message, generating a candidate recovery message based on the message to deliver using the stored check bits 308-1. Since the message transmitter 104 is used to transmit messages that generally differ slightly from the previously delivered message, the recovery algorithm attempts to recover the previously delivered message by correcting the message to be delivered using the recovery bits of the previously delivered message. The recovery generates the candidate recovery message that is later tested to determine whether the recovery is successful or not. If the candidate recovery message is the previously delivered message, the recovery is successful. If the candidate recovery message is not the previously delivered message, the recovery is unsuccessful.

For example, Reed-Solomon codes are a group of error-correcting codes that can generate check bits and correct errors in messages. These same codes can be implemented as the recovery algorithm to recover the previously delivered message that differs slightly from the message to be delivered, on which the error-correcting will be performed using the stored check bits 308-1 of the previously delivered message.

As with error-correcting codes, the stored check bits 308-1 and the stored checksum 308-2 guide the recovery of the previously delivered message. Also similar to error-correcting codes, since the difference between messages is slight, the difference is similar to errors or alterations in messages experienced during transmission. Therefore, the recovery bits of the previously delivered message can restore the previously delivered message from the slightly different present message to be delivered.

Moreover, since the message transmitter 104 is also implementing delta compression to transmit messages, in a situation where the previously recovered message cannot be recovered based on the recovery bits, the message transmitter 104 can simply transmit the entire message to be delivered. Further, in a situation when the entire message is delivered, the difference between the messages is significant enough to obstruct recovery. Therefore, transmitting the delta or difference may not result in memory conservation because the delta may be greater than the message. Even if the previous message could be recovered in some way, there would not be any reduction in the network traffic because the delta computed between very dissimilar messages may be as big or even bigger than either message.

In various implementations, the message transmitter 104 may implement Reed-Solomon coding to generate check bits and recover prior messages. Other error-correcting codes could also be employed as well, such as low-density parity-check (LDPC) codes (also called Gallaher codes), offering a variety of block sizes and error-correcting characteristics.

The checksum used may be calculated using, for example: Adler32, secure hash algorithm 1 (SHA-1), SHA-2, message digest 5 (MD5), cyclic redundancy check (CRC), etc. The checksum should be generated in such a way as to avoid collisions, meaning that a message containing errors is mathematically unlikely to have the same checksum as the uncorrupted message. However, since the checksum is not guarding against malicious actors in a communications channel, the one-way properties of cryptographic hashes may not be required.

As described, the check bits allow the message to be corrected, traditionally during transmission. As implemented in the message communication system 100, the check bits are used to avoid storing previously delivered messages and instead storing their check bits that can be used to recover the previously delivered message from the message. Therefore, the message transmitter 104 no longer needs to store the previously delivered message and instead stores the recovery bits, including the check bits and checksum, of the previously delivered message. In such an implementation, the message transmitter 104 enjoys the benefit of lower memory usage since the previously delivered message is larger than the recovery bits derived from the message.

The memory savings by the message transmitter 104 depend on which error-correcting code and checksum are being used. For example, a 255/223 Reed-Solomon code takes a 223 byte message (which may be the result of a larger data source being split into 223-byte messages) and generates 32 bytes of check bits. The checksum may be calculated using Adler32, resulting in an additional 4 bytes. Therefore, the message transmitter 104 would store 36 bytes instead of the 223 bytes needed to store the previously delivered message. This and some additional numerical examples are shown here simply for illustration (all sizes in bytes):

| Algorithms | Message Size | Encoded Size | Check bits Size (B) | Checksum Size (C) | Total Recovery Bits Size T = (B + C) | Memory Usage (T/M) |
|---|---|---|---|---|---|---|
| LDPC, Adler32 | 813 | 1057 | 244 | 4 | 248 | 31% |
| LDPC, SHA1 | 4094 | 4376 | 282 | 20 | 302 | 7% |
| R—S, MD5 | 223 | 255 | 32 | 16 | 48 | 22% |
| R—S Adler32 | 223 | 255 | 32 | 4 | 36 | 16% |

While reducing the amount of data stored results in additional computation time to recover the previously delivered message and compute recovery bits, the additional computational time is still reduced due to improved memory locality. That is, the less data that the CPU needs to acquire from slower sources, the faster the computation.

In various implementations, the recovery module 312 forwards an indication of success or failure to a selection module 314. When the recovery module 312 generates the candidate recovery message, an indication of success is forwarded to the selection module 314 because something was generated. However, the recovery module 312 may fail to recover the previously delivered message without generating the candidate recovery message. When the recovery module 312 fails to generate the candidate recover message, the recovery module 312 forwards an indication of failure to the selection module 314.

Once recovery is attempted, the recovery module 312 forwards the recovered message to a checksum calculation module 316. The checksum calculation module 316 calculates a recovered checksum of the recovered message. The checksum calculation module 316 forwards the recovered checksum to a comparison module 320. The comparison module 320 compares the stored checksum of the previously delivered message to the recovered checksum of the recovered message. If the stored checksum and the recovered checksum is different, then the previously stored message was not properly recovered. Therefore, the previously stored message and the message to be delivered are too different.

Since the previously stored message cannot be recovered, a delta cannot be computed and transmitted. However, in this case, transmitting the message as a whole is more advantageous as the delta may be more complicated than the message, resulting in a larger amount of data being transferred. The entire message can be transmitted as a wrapper delta, which is a construct that conforms to the structure that all deltas follow but includes the entire contents of the message. The wrapper delta may also indicate to the message receiver 108 that the entire message, as opposed to simply the delta, is being transmitted.

The recovery module 312 also forwards the recovered message to a delta compression module 324. The message and the recovered, previously stored message are forwarded to the delta compression module 324. The delta compression module 324 determines the delta or difference between the previously delivered message and the message. In various implementations, the delta may be the check bits of the message to deliver. In such an implementation, the check bits of the message to deliver are transmitted and used by the message receiver to recover the message to deliver by implementing error-correcting codes using the previously delivered message and the check bits of the message to deliver.

The comparison module 320 forwards an indication whether the stored and recovered checksums match or indicate that the previously delivered message was not properly recovered to the selection module 314. The selection module 314 forwards a selection to a multiplexer 328. The multiplexer 328 receives the message to deliver as well as the compressed delta. Based on the indication from the selection module 314, the multiplexer 328 selects the delta or the message to deliver to forward to a message delivery module 332.

The multiplexer 328 forwards the delta if the selection module 314 forwards an indication that the recovered checksum and the stored checksum confirm that the previously delivered message was properly recovered by the recovery module 312 and the recovery module 312 indicated a successful generation of the candidate recovery message. Otherwise, if the stored checksum and the recovered checksum do not confirm the recovery and/or the recovery module 312 indicated a failed attempt at generating the candidate recovery message, the multiplexer 328 selects the message to deliver to forward to the message delivery module 332. The message delivery module 332 is configured to transmit the delivery message (either the entire message as the wrapper delta or the delta) to the message receiver 108. In various implementations, the message delivery module 332 generates the wrapper delta of the entire message for transmission.

The message to deliver is also forwarded to a recovery bit generation module 336. After or during recovery of the previously delivered message, the recovery bit generation module 336 generates recovery bits, including check bits by a check bits calculation module 336-1 and a checksum by a checksum calculation module 336-2, for the message to be delivered. The recovery bit generation module 336 forwards the recovery bits to the recovery bit storage 308 to replace the recovery bits of the previously delivered message. Therefore, only the most recent recovery bits are being stored at a given time to conserve memory.

Figure 4:
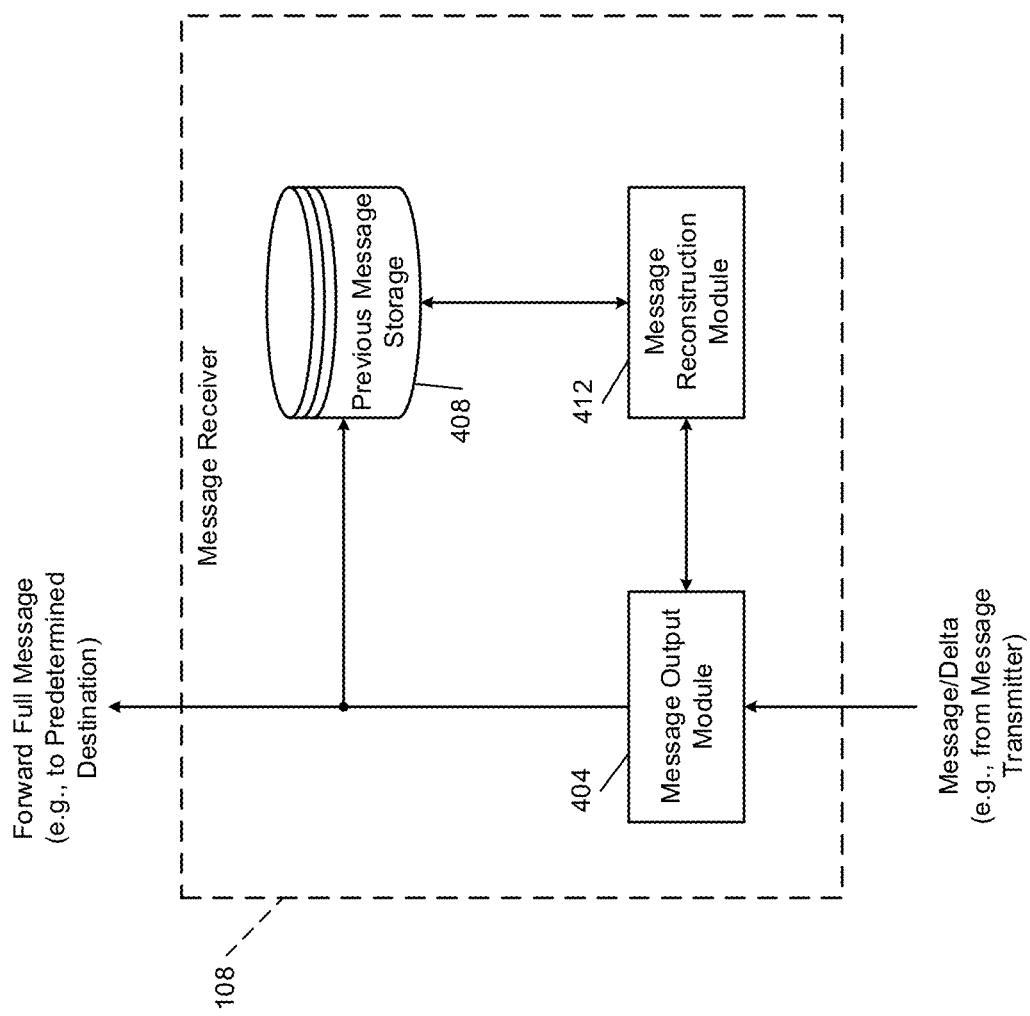
FIG. 4 is a functional block diagram of an example message receiver according to the principles of the present disclosure.

FIG. 4 is a functional block diagram of an example message receiver according to the principles of the present disclosure. The message receiver 108 includes a message output module 404 that receives the wrapper delta or delta from the message transmitter 104. The message output module 404 determines a message type of the incoming message. That is, the message output module 404 identifies whether the message is the entire message or the delta. If the message output module 404 determines that the transmitted message is the entire message, the entire message is forwarded to a previous message storage 408 and the predetermined destination. In various implementations, the predetermined destination is the same location for all messages. Alternatively, the incoming message may include an indication of a destination.

The previous message storage 408 may store all the previous messages. In various implementations, the previous message storage 408 may only store a most recent message and replace the most recent message each time a new message is received. If the message output module 404 determines that the message transmitter 104 transmitted the delta, the message output module 404 forwards the delta to a message reconstruction module 412. The message reconstruction module 412 obtains the previously delivered message from the previous message storage 408. Then, the message reconstruction module 412 updates the previously delivered message based on the delta, or change between the previously delivered message and the message, to compute the message. The message reconstruction module 412 stores or replaces the previously delivered message with the message and forwards the message to the message output module 404, which then forwards the full message to the predetermined destination.

Figure 5:
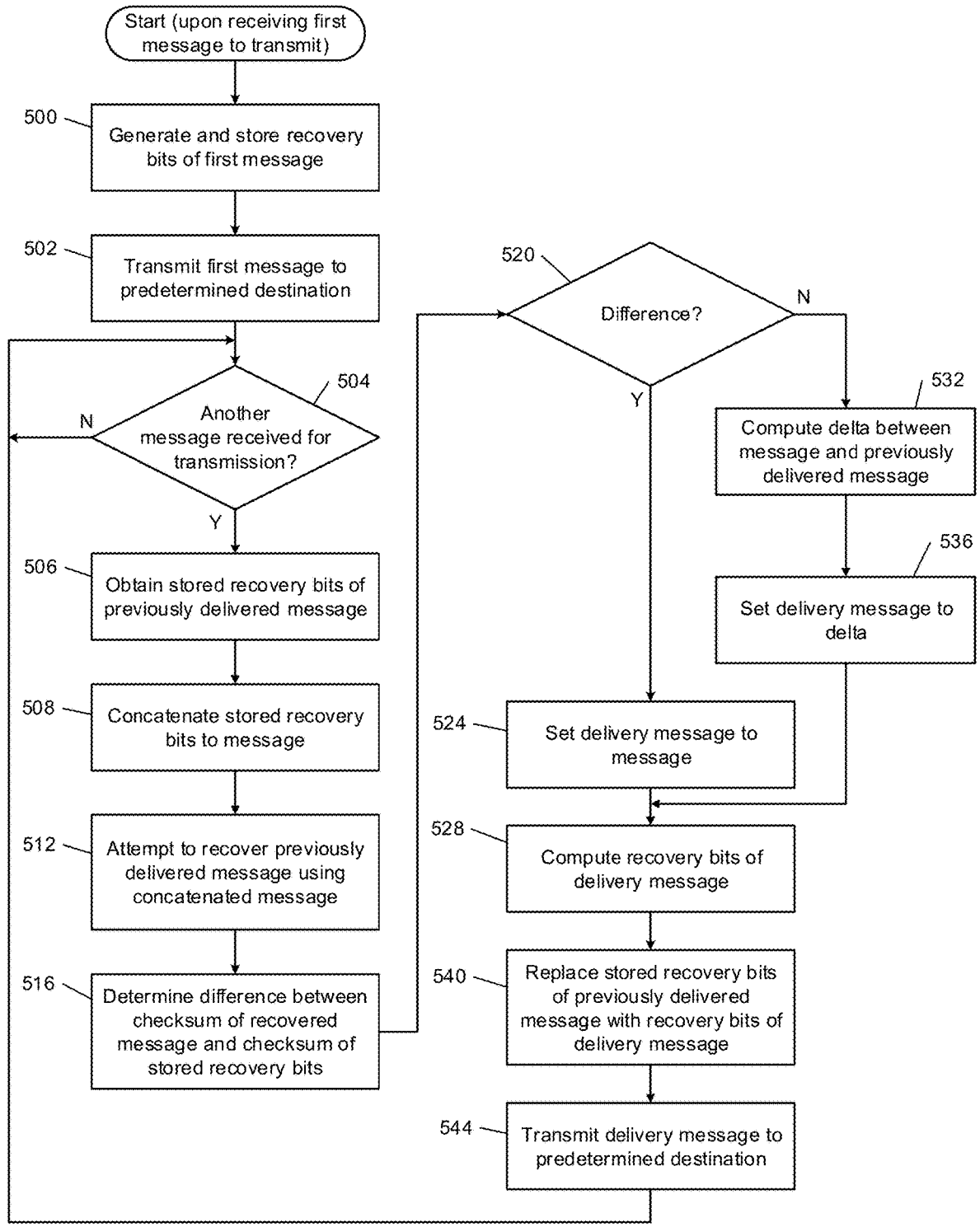
FIG. 5 is a flowchart depicting example message preparation and transmission according to the principles of the present disclosure.

FIG. 5 is a flowchart depicting example message preparation and transmission according to the principles of the present disclosure. Control begins upon receiving a first message for transmission. As described above, the message may include value information relating to, for example, stocks, statistics, or other numerical information. In various implementations, the message may include data related to non-numerical information. Once received, at 500 control generates recovery bits of the first message. Control continues to 502 to transmit the first message to the predetermined destination indicated in the message. In various implementations, the first message is converted into a wrapper delta for transmission to the predetermined destination.

Once transmitted, control proceeds to 504 to determine if another message has been received for transmission. If not, control waits at 504 for another message for transmission to be received. Otherwise, control continues to 506 to obtain stored recovery bits of the previously delivered message.

Control continues to 508 to concatenate the stored recovery bits to the message. At 512, control attempts to recover the previously delivered message using the concatenated message. As described above, this recovery method operates based on the assumption that the previously delivered message and the message are similar. Therefore, the recovery bits, including the check bits and checksum, may be used to recover the previously delivered message from the message. As is true with error-correcting codes, the recovery bits can be used to correct for errors occurring during transmission. While the differences between the previously delivered message and the message are not errors, the recovery bits may be used in a similar manner to recover the previously delivered message, obviating a need to store the previously delivered message, and saving a significant amount of memory.

Control then proceeds to 516. Control calculates a checksum from the recovered message. Control then determines a difference between the checksum of the recovered message and the checksum of the previously stored recovery bits because any difference will precipitate transmitting the entire message instead of the delta. If any difference exists at 520, control continues to 524 to set the delivery message to the message. That is, the attempt to recover the previously delivered message was unsuccessful. Therefore, the entire message will be transmitted. Then, control proceeds to 528 to compute the recovery bits of the delivery message. Otherwise, if no difference exists at 520, control continues to 532 to compute the delta between the message and the previously delivered message. At 536, control sets the delivery message to delta and continues to 528.

At 540, control replaces the stored recovery bits of the previously delivered message with the computed recovery bits of the delivery message. Control proceeds to 544 to transmit the delivery message to the predetermined destination. Then, control ends.

Figure 6:
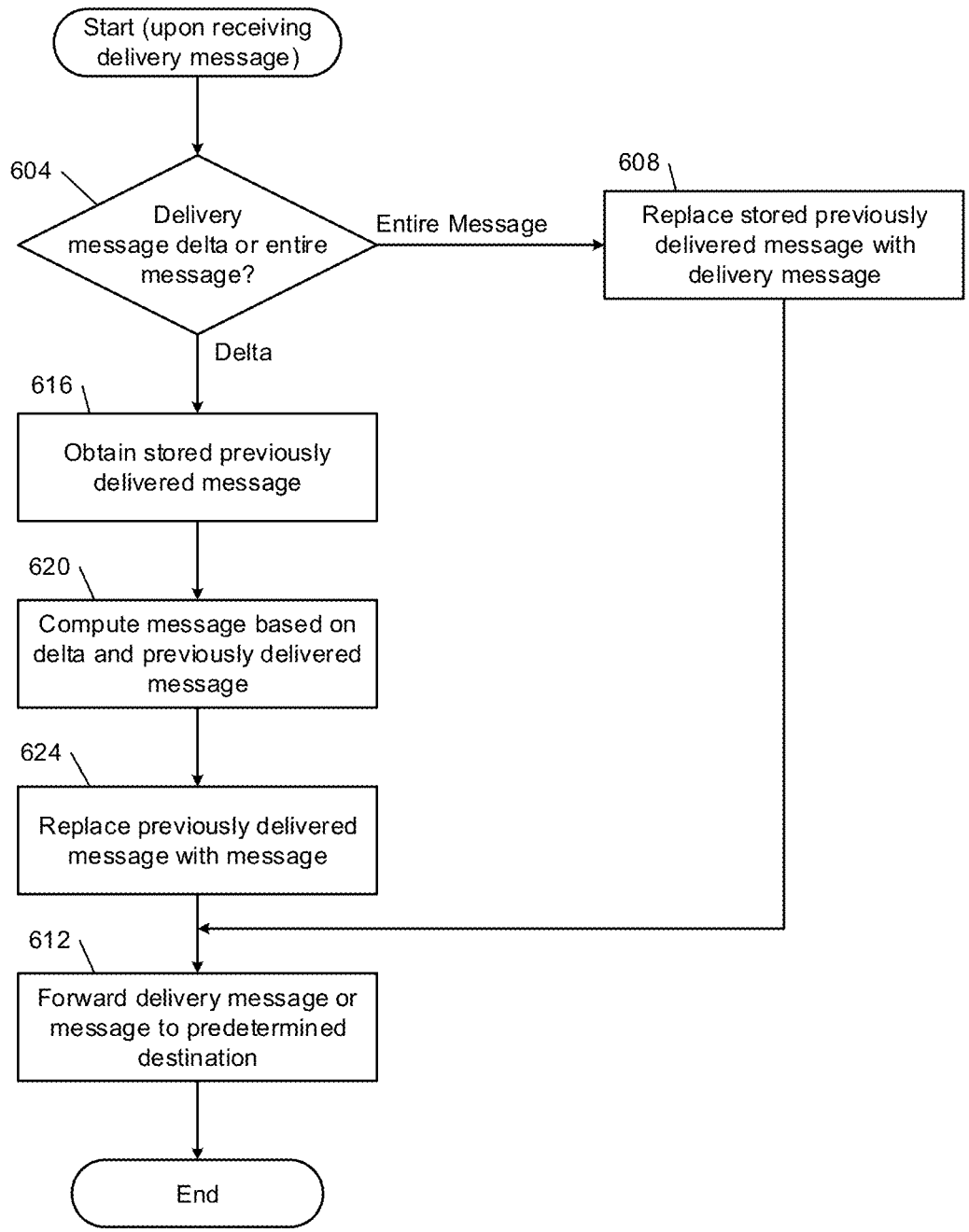
FIG. 6 is a flowchart depicting example message reception and updating according to the principles of the present disclosure.

FIG. 6 is a flowchart depicting example message reception and updating according to the principles of the present disclosure. Control begins upon receiving the delivery message. At 604, control determines whether the delivery message is delta or the entire message (for example, the wrapper delta). In various implementations, control determines whether the delivery message is delta or the entire message based on size. Control may also determine whether the delivery message is delta or the entire message based on an indication include in the delivery message. If control determines that the entire message was transmitted, control proceeds to 608 to replace the stored previously delivered message with the delivery message. Then, control continues to 612 to forward the delivery message to the predetermined destination.

Otherwise, if control determines that the delta was transmitted at 604, control continues to 616 to obtain the stored previously delivered message. Control proceeds to 620 to compute the message based on the delta and the previously delivered message. Control then proceeds to 612 to forward the message to the predetermined destination.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A. The term subset does not necessarily require a proper subset. In other words, a first subset of a first set may be coextensive with (equal to) the first set.

In this application, including the definitions below, the term "module" or the term "controller" may be replaced with the term "circuit." The term "module" may refer to, be part of, or include processor hardware (shared, dedicated, or group) that executes code and memory hardware (shared, dedicated, or group) that stores code executed by the processor hardware.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are the BLUETOOTH wireless networking standard from the Bluetooth Special Interest Group and IEEE Standard 802.15.4.

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A non-transitory computer-readable medium comprising instructions including:
   in response to receiving a new message for transmission, generating a candidate message by attempting recovery of a previous message from (i) the new message and (ii) recovery bits of the previous message;
   in response to an indicator indicating that the attempted recovery was successful, computing a delta between the new message and the candidate message and generating a delivery message based on the computed delta;
   in response to the indicator indicating that the attempted recovery was unsuccessful, generating the delivery message based on the new message exclusive of the computed delta;
   calculating new recovery bits from the new message;
   storing the new recovery bits as the recovery bits of the previous message; and
   transmitting the delivery message to a destination over a communications channel.

2. The computer-readable medium of claim 1 wherein storing the new recovery bits includes replacing the recovery bits of all previous messages.

3. The computer-readable medium of claim 1 wherein the instructions further include:
   calculating a candidate checksum from the candidate message; and
   in response to a checksum of the previous message being different than the candidate checksum, setting the indicator to indicate that the attempted recovery was unsuccessful,
   wherein the recovery bits of the previous message include the checksum of the previous message.

4. The computer-readable medium of claim 3 wherein the instructions further include setting the indicator to indicate that the attempted recovery was unsuccessful in response to a failure to generate the candidate message.

5. The computer-readable medium of claim 4 wherein the instructions further include skipping calculating the candidate checksum in response to the failure to generate the candidate message.

6. The computer-readable medium of claim 1 wherein the attempted recovery of the previous message is performed using an error-correcting code.

7. The computer-readable medium of claim 6 wherein the instructions further include generating the new recovery bits from the new message using the error-correcting code.

8. The computer-readable medium of claim 7 wherein:
   the attempted recovery of the previous message is performed using Reed-Solomon decoding; and
   the new recovery bits are calculated from the new message using Reed-Solomon encoding.

9. The computer-readable medium of claim 1 wherein attempting recovery includes concatenating the new message with at least some of the recovery bits of the previous message to generate a combined message and attempting recovery from the combined message.

10. The computer-readable medium of claim 1 wherein generating the delivery message based on the new message includes generating a wrapper delta including the new message and incorporating the wrapper delta into the delivery message.

11. The computer-readable medium of claim 1 wherein the delivery message generated based on the computed delta includes the computed delta and excludes unmodified portions of the new message.

12. The computer-readable medium of claim 1 wherein the communications channel is lossy.

13. The computer-readable medium of claim 1 wherein the instructions further include, in response to receiving the delivery message at the destination:
   in response to the delivery message including an entire message, setting the entire message as an output message;
   in response to the delivery message including the delta, generating the output message based on the delta and a prior received message; and
   outputting the output message,
   wherein the destination stores the prior received message.

14. The computer-readable medium of claim 13 wherein the instructions further include replacing the prior received message with the output message.

15. The computer-readable medium of claim 13 wherein the delivery message includes a type indication denoting whether the delivery message includes the delta or the entire message.

16. A system comprising:
   a recovery module configured to, in response to receiving a new message, generate a candidate message by attempting recovery of a previous message from (i) the new message and (ii) recovery bits of the previous message;
   a delta compression module configured to compute a delta between the new message and the candidate message;
   a selection module configured to:
      in response to an indicator indicating that the attempted recovery was successful, generate a delivery message based on the computed delta; and
      in response to the indicator indicating that the attempted recovery was unsuccessful, generate the delivery message based on the new message exclusive of the computed delta;
   a recovery bit calculation module configured to:
      calculate new recovery bits from the new message;
      store the new recovery bits as the recovery bits of the previous message; and
   a message delivery module configured to transmit the delivery message to a destination over a communications channel.

17. The system of claim 16 wherein the recovery bit calculation module is configured to replace the recovery bits of all previous messages when storing the new recovery bits.

18. The system of claim 16 further comprising a checksum module configured to:
   in response to receiving the candidate message, calculate a candidate checksum from the candidate message;
   compare the candidate checksum to a checksum of the previous message, wherein the checksum of the previous message is included in the recovery bits of the previous message; and in response to the checksum of the previous message being different than the candidate checksum, set the indicator to indicate that the attempted recovery was unsuccessful.

19. The system of claim 16 wherein:

the computed delta is a compressed delta between the new message and the candidate message; and generating the delivery message based on the new message exclusive of the computed delta includes generating a wrapper delta including the new message and incorporating the wrapper delta into the delivery message.

20. The system of claim 16 further comprising a receiver module configured to:

store a prior received message;

receive the delivery message over the communication channel;

in response to the delivery message including an entire message, set the entire message as an output message;

in response to the delivery message including the delta, generate the output message based on the delta and the prior received message; and output the output message.

* * * * *